(12) United States Patent
Hackl et al.

(10) Patent No.: US 10,564,189 B2
(45) Date of Patent: Feb. 18, 2020

(54) INTEGRATED CIRCUIT USING A DIGITAL METHOD FOR AC/DC-SENSITIVE RESIDUAL CURRENT MEASUREMENT

(71) Applicant: Bender GmbH & Co. KG, Gruenberg (DE)

(72) Inventors: Dieter Hackl, Fernwald (DE); Michael Kammer, Hungen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 227 days.

(21) Appl. No.: 14/297,826

(22) Filed: Jun. 6, 2014

(65) Prior Publication Data

US 2014/0361765 A1    Dec. 11, 2014

(30) Foreign Application Priority Data

Jun. 10, 2013  (DE) .................. 10 2013 210 800

(51) Int. Cl.
*G01R 19/00*   (2006.01)
*G01R 19/10*   (2006.01)
*G01R 15/18*   (2006.01)
*H02H 3/33*    (2006.01)

(52) U.S. Cl.
CPC .......... *G01R 19/10* (2013.01); *G01R 15/185* (2013.01); *H02H 3/33* (2013.01)

(58) Field of Classification Search
CPC ...... G01R 19/10; G01R 15/185; G01R 19/20; G01R 33/04; H02H 3/33
USPC ........ 324/117 R, 117 H, 253, 254, 255, 263, 324/126, 127, 244, 99 R
See application file for complete search history.

(56) References Cited

U.S. PATENT DOCUMENTS

| 4,513,339 A   |   | 4/1985 | Ishigami et al. |
| 4,899,103 A | * | 2/1990 | Katzenstein ......... G01R 15/185 324/117 R |
| 5,008,612 A | * | 4/1991 | Otto ..................... H01F 38/32 323/356 |

(Continued)

FOREIGN PATENT DOCUMENTS

| CN | 1712973 A   | 12/2005 |
| CN | 101282035 A | 10/2008 |

(Continued)

OTHER PUBLICATIONS

English translation of First Office Action of State Intellectual Property Office of People's Republic of China for Patent Application No. 201410252679.3, dated Dec. 20, 2017.

*Primary Examiner* — Lee E Rodak
(74) *Attorney, Agent, or Firm* — Quarles & Brady LLP

(57) ABSTRACT

A method and a device for a galvanically isolated AC/DC-sensitive measurement of a residual current ($\Delta I$), includes a component sensitive to magnetic fields which switches between at least two states in the course of oscillation. A magnetic field is formed in a sphere of action of the component sensitive to magnetic fields due to the residual current ($\Delta I$) and an oscillator signal that switches between a state 1 and a state 2. As a function of the residual current-driven magnetic field, times of stay of the oscillator signal occurring in states 1 and 2 are determined and an output signal proportional to the residual current is obtained from the ratio of the times of stay.

18 Claims, 4 Drawing Sheets

(56) References Cited

U.S. PATENT DOCUMENTS

| | | | | |
|---|---|---|---|---|
| 5,229,725 A | * | 7/1993 | Spaeder | G01R 19/255 324/509 |
| 5,345,169 A | * | 9/1994 | Etter | G01R 15/185 324/117 R |
| 6,522,517 B1 | * | 2/2003 | Edel | G01R 15/185 361/143 |
| 2004/0183522 A1 | | 9/2004 | Gunn et al. | |
| 2009/0108833 A1 | * | 4/2009 | Ziegler | G01R 15/185 324/117 R |
| 2012/0062209 A1 | * | 3/2012 | Teppan | G01R 15/185 324/76.75 |
| 2012/0139527 A1 | * | 6/2012 | Teppan | G01R 19/20 324/127 |
| 2012/0299573 A1 | * | 11/2012 | Vangool | H01F 38/32 323/358 |

FOREIGN PATENT DOCUMENTS

| | | |
|---|---|---|
| CN | 102422174 A | 4/2012 |
| EP | 2378295 A1 | 10/2011 |
| GB | 2432008 A | 5/2007 |
| WO | 9313581 A1 | 7/1993 |

\* cited by examiner

INTEGRATED CIRCUIT USING A DIGITAL METHOD FOR AC/DC-SENSITIVE RESIDUAL CURRENT MEASUREMENT

CROSS REFERENCE TO RELATED APPLICATION

This application claims the priority benefit of German Patent Application No. 10 2013 210 800.1 filed on Jun. 10, 2013, which is fully incorporated herein by reference.

STATEMENT REGARDING FEDERALLY SPONSORED RESEARCH OR DEVELOPMENT

Not applicable.

FIELD OF THE INVENTION

The invention relates to a method and to a device for a galvanically isolated AC/DC-sensitive measurement of a residual current, including an oscillator circuit that has a component sensitive to magnetic fields which switches between at least two states in the course of the oscillation, a magnetic field being formed in the sphere of action of the component sensitive to magnetic fields due to the residual current, and the oscillator circuit generating an oscillator signal which switches between a state 1 and a state 2.

BACKGROUND OF THE INVENTION

There are known measuring methods and measuring devices for monitoring electrical systems, such as residual current measuring devices (RCMs) or residual current protective devices (RCDs). These known methods and devices are mainly based on the principle of the galvanically isolated residual current measurement, in which all active conductors of an electric line to be monitored are guided as a primary winding through a measuring current transformer having a current transformer core made of ferromagnetic material and having at least one secondary winding. In the fault-free operation of the electrical system, the vectorial sum of the currents on all live conductors of the line is zero and thus there is no magnetic field surrounding said line. If a fault current occurs due to an insulation fault in the electrical system, for example, which flows through a body outside of the line or to ground, a residual current is the result. The variable magnetic field of said residual current induces a current on the secondary side which can be evaluated and which may trigger a report (RCM) or activate a switching member (RCD) which disconnects the faulty line.

In the simplest version, due to the induction principle, devices of this kind are only capable of detecting temporal changes of the magnetic flux and thus, in practice, can only detect pure alternating fault currents or alternating residual currents. However, loads connected to the electrical system, such as electrical machines having electronic semiconductor components like diodes or thyristors in rectifiers or frequency converters, can also cause residual currents that do not have a purely sinusoidal but a pulsating temporal progression or form a pure direct (residual) current. To be able to detect these types of residual currents as well, methods for AC/DC-sensitive residual current measurement were developed.

These developments include known methods and devices in which the measuring current transformer is integrated as a oscillation-generating element in a push-pull oscillator, and in which direct current magnetizations are compensated by an oscillator current applied at the secondary side.

Also, a method is known in which a current transformer core having a nonlinear magnetization curve is used as a component sensitive to magnetic fields in an oscillator circuit implemented as a relaxation oscillator circuit (relaxation oscillator). The relaxation oscillator circuit causes the nonlinear magnetization curve to be traveled in an oscillating manner between the positive and negative saturation as a result of a controlled secondary-side current flow, wherein the current transformer core switches between two easily distinguishable magnetic states in the course of the oscillation. A temporally modulated oscillator signal can be derived from the temporal progression of the secondary (oscillator) currents, said oscillator signal switching between a state 1 and a state 2, and wherein the duration of the respective signal portions in state 1 and 2 (times of stay) occur as a function of the residual current. The direct portion proportional to the residual current is determined by means of a suitable demodulation in an evaluation circuit by averaging via analog low-pass filtering, for example.

It proves disadvantageous in the known methods for AC/DC-sensitive residual current measurement that unavoidable production-related tolerances in the components of the oscillator circuit and in the evaluation circuit lead to measuring errors and compromise the reliability of the measurement. In particular, a demodulation by analog low-pass filtering makes high demands to the quality of the used components, which can oftentimes only be met by a paired selection of the components, which raises costs. To achieve precise measurement results, the known methods also require observing tightly specified parameters for the component sensitive to magnetic fields. Moreover, the dynamic range is strictly predefined by the choice of components so that the range of application is often limited.

SUMMARY OF THE INVENTION

Therefore, it is the object of the present invention to develop a method and a device for the galvanically isolated AC/DC-sensitive measurement of a residual current which provide a reliable measurement in a wide range of applications at low production costs of the device.

This object is attained with respect to a method in that times of stay of the oscillator signal occurring in states 1 and 2 are determined as a function of the residual current-driven magnetic field and an output signal proportional to the residual current is obtained from the ratio of said times of stay.

The idea of the present invention is based on determining the respective times of stay of the temporally modulated oscillator signal in states 1 and 2, which are influenced by the residual current-driven magnetic field, and on obtaining an output signal proportional to the residual current from the ratio of said times of stay.

In this context, the concrete implementation of the oscillator circuit is immaterial to the applicability of the invention. The important aspect is the presence of a component sensitive to magnetic fields that is able to take on two states in the course of the oscillation which are clearly distinguishable from each other. Such a component sensitive to magnetic fields can be integrated as a component determining the progression of the oscillator signal in a relaxation oscillator circuit in such a manner that an oscillator signal is generated which switches between the (electrical) states 1 and 2.

By way of example, the course of the method will be explained on the basis of a realization of the oscillator circuit as a relaxation oscillator circuit in combination with a measuring current transformer and two inductively coupled secondary windings. In this context, a nonlinear magnetization curve of the current transformer core is assumed, which can be approximately represented by a piecewise linear progression with adjacent areas of saturation. In the course of the oscillation, i.e. when traveling the entire magnetization characteristic, the component sensitive to magnetic fields—here the current transformer—takes on two easily distinguishable (magnetic) states: a state in the linear range on the one hand and a state in the saturated range on the other hand.

The line to be monitored acts as a primary winding, wherein an operating point predetermined by the value and type of the residual current occurs on the magnetization curve. The operating point can be temporally constant (direct residual current) and also travel on the magnetization curve if the residual current is temporally variable.

Due to a positive feedback circuit of the secondary coils based on inductive coupling, the oscillator switches in the saturation points, a steadily increasing current in one of the two secondary circuits switching into a steadily decreasing current while a steadily decreasing current in the respectively other secondary circuit switches into a steadily increasing current. Thus, a sign reversal of the differentiated (temporally derived) secondary current takes place in the saturated state of the current transformer core, wherein the current flow times starting from the operating point predetermined by the residual current until arriving at the saturating points differ as a function of the position of the operating point and lead to a temporal modulation of the sign function applied to the respective differentiated secondary currents.

Thus, the traveling of the magnetization characteristic is represented in the times of stay of the oscillator signal by means of a function that is as linear as possible, wherein the times of stay, which correspond to the traveled distances on the magnetization curve, occur as a function of the operating point. For example, if the operating point is close to the upper saturation point on the linear section of the magnetization curve due to a relatively high residual current, a shorter distance is traveled on the linear section in the course of the oscillation caused by the secondary (oscillator) currents until the upper saturation point is achieved than in case of a smaller residual current and a shorter time of stay occurs. The temporally modulated oscillator signal thus has high/low phases (state 1/state 2) that differ in length depending on the position of the operating point and thus as a function of the residual current.

In consequence, irrespective of the concrete implementation of the oscillator circuit, an evaluable electrical signal (oscillator signal) has to be made available for the implementation of the subsequent method steps, the signal comprising information on the changes in state of the component sensitive to magnetic fields in its temporal progression.

To recover said information and thus to obtain the desired output signal proportional to the residual current, the times of stay of the oscillator signal in states 1 and 2 are determined and correlated according to the invention.

In this manner, a highly universally applicable method can be provided independently of a concrete realization of the oscillator circuit which allows a fast and reliable residual current measurement.

In a further advantageous design, the times of stay are determined via a counting pulse that is derived from an oscillator frequency and whose clock ratio is many times higher than the oscillator frequency.

By means of the counting pulse derived from the oscillator frequency, the times of stay in state 1 and state 2 are counted and a pulse/period ratio is determined therefrom. Said ratio is proportional to the residual current in the relevant residual current measuring range in a largely linear context. Coupling the counting pulse to the oscillator frequency leads to less dependency of the measurement result from temperature or long-term drifts. A practically always present drift of the oscillator frequency does not influence the accuracy of the measurement. Moreover, the many times higher clock rate leads to a higher precision of the measurement accompanied by an increased measuring dynamic.

Advantageously, the oscillator signal is generated and the times of stay are determined and the output signal proportional to the residual current is obtained on a digital level by methods of digital signal processing in an integrated circuit.

This form of implementation of the method permits registering dependencies of physical values that occur within and outside of the oscillator circuit (e.g. current, voltage and frequency of the oscillator signal, characteristic values of the component sensitive to magnetic fields, temperature) in an interrelated manner and to include them in the determination of a reliable measurement result. By way of the integral approach, the method can be adapted to the respective measuring task while reducing interferences, a high accuracy of the measurement being achievable in a large dynamic range.

Digital signal processing algorithms allow widening the dynamic measuring range at simultaneously increased accuracy of the measurement. This is accompanied by less dependency of the strict fulfillment of tightly specified parameters for external components; in particular, the component sensitive to magnetic fields can have larger tolerance ranges and thus help lower costs. Moreover, this digital evaluation principle can effectively handle interferences by temperature and long-term drifts.

It is advantageous if the output signal proportional to the residual current is output as an analog signal. Thus, a direct further processing of the measurement result is possible on an analog level.

Preferably, the output signal proportional to the residual current is also output as a digital signal via a digital interface. Additionally to the analog output signal, a digital output signal proportional to the residual current is thus provided which is transmitted via the digital interface according to a defined interface protocol.

Advantageously, the method is designed such that analog and digital signals can be processed in the integrated circuit. This design allows a highly integrated implementation of the method in a circuit without expensive external components.

Advantageously, the oscillator circuit is controlled by a monitoring and control unit. The monitoring and control unit is able to check parameter values and to make corrections if needed. In case a relaxation oscillator circuit is realized with a measuring current transformer, the parameters of the supply unit for the secondary circuits can be optimized in this way, for example.

The control of the oscillator circuit by the monitoring and control unit is preferably based on a model of the used component sensitive to magnetic fields. This leads to an increase in error tolerance to variations in production quality in the production of components sensitive to magnetic fields so that sufficient measurement results can also be achieved with simple components sensitive to magnetic fields. Moreover, accuracy, stability and reliability of the measurement are improved.

The function of the oscillator circuit can be tested and monitored by means of a diagnostic unit. The method is advantageously designed in such a manner that its fault-free implementation is continuously monitored by the diagnostic unit. In combination with the ability of performing a function test, thus, an effective instrument is available which makes the method applicable for safety-critical measuring tasks.

Preferably, the method is intended to be implemented as an application-specific integrated circuit.

With reference to a device for a galvanically isolated AC/DC-sensitive measurement of a residual current, the object is attained in connection with an evaluation circuit for determining times of stay of the oscillator signal occurring in states 1 and 2 as a function of the residual current-driven magnetic field and for obtaining the output signal proportional to the residual current from the ratio of said times of stay.

The advantageous technical effects described with respect to the method also apply to the device realizing the method.

Implementing the method steps according to the invention, a corresponding device comprises according to the invention an evaluation circuit which determines the respective times of stay in states 1 and 2 of the temporally modulated oscillator signal and obtains an output signal proportional to the residual current from the ratio of said times of stay.

Information regarding the value of the residual current to be determined lies in the differing length of the high/low phases of the modulated oscillator signal, i.e. in the difference of the respective times of stay in state 1 and state 2. The evaluation circuit determines said times of stay and obtains a statement regarding the value of the residual current from the ratio of the times of stay.

In another advantageous embodiment, the evaluation circuit for determining the times of stay comprises a counting circuit for generating a counting pulse which is derived from an oscillator frequency and whose clock rate is many times higher than the oscillator frequency.

Thus, the times of stay are determined via a fast counting pulse. The latter is coupled to the oscillator frequency so that, advantageously, a drift of the oscillator frequency does not affect the accuracy of the measurement.

Furthermore, the oscillator circuit and the evaluation circuit are implemented as digital circuits in an integrated circuit.

The integration of the functional blocks and their implementation in an integrated circuit permit an increased reliability of the residual current measurement accompanied by low production costs of the measuring device as compared to the realization as discrete electronic components known from the state of the art because there is no extensive selection of components and no need for alignment work. Compared to the assembly of discrete components, the digital oscillator circuit has a substantially larger range of application because the integrated circuit can be configured for the respective measuring task and yields more accurate measurements. The digital evaluation circuit is based on a combination of precise comparators, fast digital counters with a wide dynamic range, a fast dividing arithmetic unit and digital averaging.

Additionally, the integrated circuit proves much more insensitive to external interferences because the interferences are registered, evaluated and compensated as a whole, taking into account further dependencies.

Furthermore, the digital evaluation circuit has a signal output for an output signal proportional to the residual current which is converted to analog.

The output signal proportional to the residual current, which is generated in the digital evaluation circuit and present in digital form, is converted into an analog output signal and output so as to permit the measurement result to be processed further on an analog level.

In addition to the D/A-converted analog output signal provided by the digital evaluation circuit, a digital interface is provided for outputting a digital output signal proportional to the residual current.

This two-channel, i.e. analog and digital, redundant form of providing the measurement result offers increased safety in safety-critical applications.

In another advantageous embodiment, the integrated circuit comprises circuit elements for processing analog and digital signals. The integrated circuit thus represents an oscillator circuit in a highly integrated form, which is able to receive and process external signals in analog and digital form. An expensive assembly of external components is largely unnecessary so that a universally applicable device for AC/DC-sensitive residual current measurement is provided in connection with an external component sensitive to magnetic fields.

In an advantageous embodiment, the integrated circuit has a monitoring and control unit for controlling the oscillator circuit. The monitoring and control unit monitors compliance with predefined values and corrects them if necessary. For example, it is used for monitoring and correcting the admissible current and voltage values in the supply unit for the external component sensitive to magnetic fields and ensures that the oscillator frequency is maintained.

Advantageously, the integrated circuit comprises storage means for storing a model of the used component sensitive to magnetic fields. Thus, a model of the respectively used component sensitive to magnetic fields is stored which the monitoring and control unit can access in order to monitor the parameters on the basis of the stored data and to correct them, if needed. Thus, when a measuring current transformer is used as the component sensitive to magnetic fields, for example, it is ensured that the oscillator operation works reliably and precisely even if the magnet core material has high tolerances. In particular, disadvantages can also be compensated which occur in the use of lower-quality components sensitive to magnetic fields, or generally higher measuring requirements can be met.

Preferably, the integrated circuit comprises a diagnostic unit for testing and monitoring the function of the oscillator circuit. Integrating a diagnostic unit increases the reliability of the measuring device over conventional solutions. In connection with the two-channel provision of the output signal, the measuring device is also especially suited for safety-critical applications.

In a preferred embodiment, the integrated circuit is implemented as an application-specific integrated circuit. An implementation of the integrated circuit as an application-specific integrated circuit (ASIC) proves advantageous in terms of low production costs in particular in case of the production of large quantities. Since the integrated circuit processes both analog and digital signals, its implementation presents a "mixed-signal" ASIC.

BRIEF DESCRIPTION OF THE DRAWINGS

Further advantageous design features result from the following description and from the drawings, which illustrate a preferred embodiment of the invention by way of example. In this context, the oscillator circuit is implemented as a relaxation oscillator circuit in combination with a measuring current transformer as the component sensitive to magnetic fields.

In the figures.

DETAILED DESCRIPTION OF THE EXAMPLE EMBODIMENT

Figure 1:
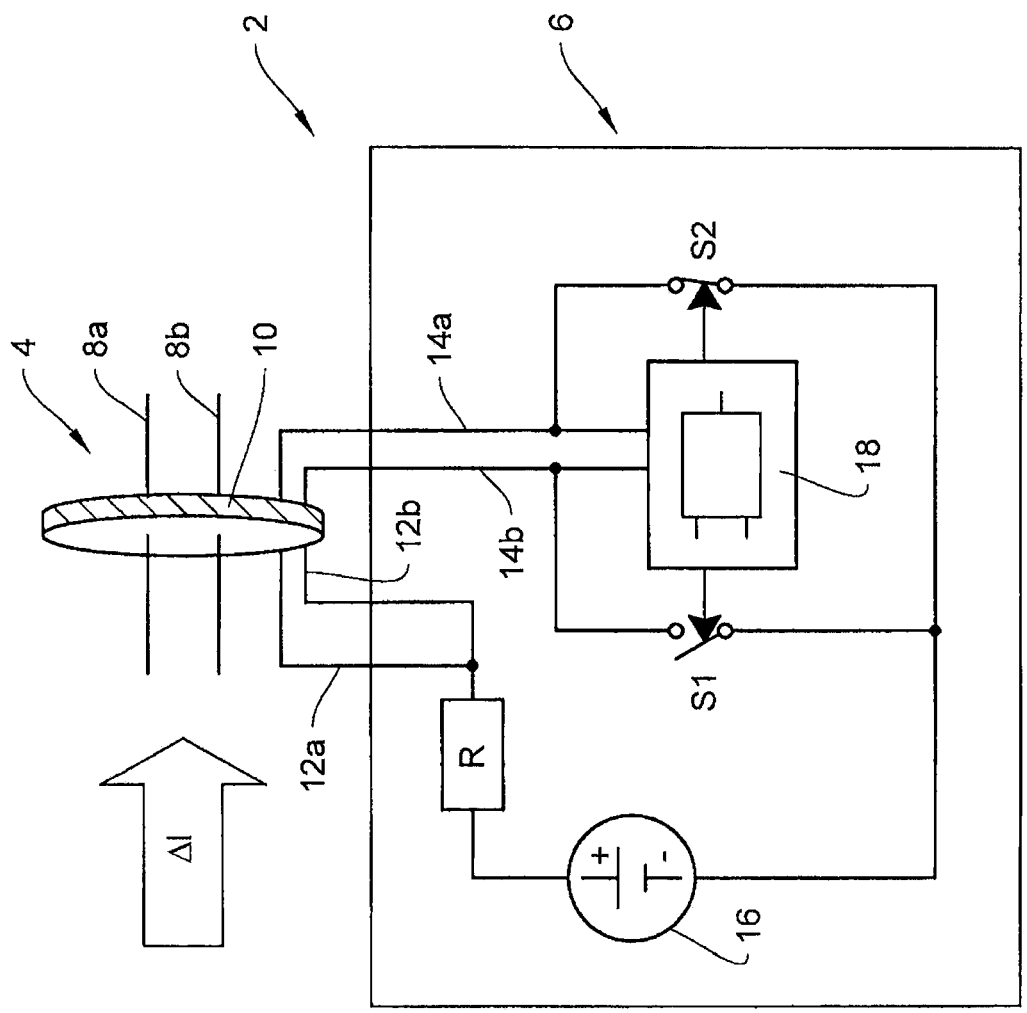
FIG. 1: shows a principle circuit diagram of a relaxation oscillator circuit.

FIG. 1 shows a principle circuit diagram of a measuring device 2 including a measuring current transformer 4 and an oscillator circuit implemented as a relaxation oscillator circuit 6. Two active conductors 8a, 8b of a line to be monitored are guided through an annular current transformer core 10 of the measuring current transformer 4. The active conductors 8a, 8b form a primary winding on which a residual current ΔI occurs in case of a fault of the electrical system. Two secondary windings 12a, 12b wound in opposite senses are inductively coupled to each other via the current transformer core 10. The secondary windings 12a, 12b form the inductive components of the relaxation oscillator circuit, which comprises two secondary electric circuits 14a, 14b, wherein a connection of the two secondary windings 12a, 12b is connected in each case to a common voltage source 16 as a supply unit via a common current-limiting series resistor R. The oscillation of the secondary currents in the secondary electric circuits 14a, 14b is controlled via the complementary-working switch elements S1, S2 by a control logic 18 which comprises a positive feedback circuit of the two secondary electric circuits 14a, 14b, in such a manner that the magnetization curve of the current transformer core 10 is completely traveled as a cause of the currents that flow in the secondary electric circuits 14a, 14b and that are driven by the voltage source 16.

Figure 2:
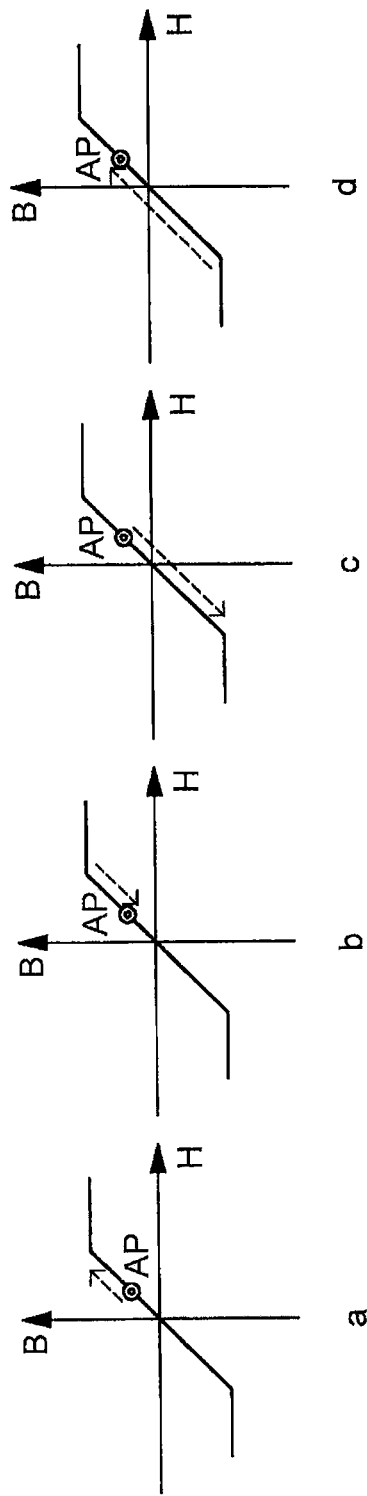
FIG. 2: shows a run through a magnetization curve.

To illustrate the mode of function of the relaxation oscillator circuit 6, a run through the magnetization curve is illustrated in FIG. 2. The nonlinear magnetization curve is designed such that the magnetically soft current transformer core 10 can be brought into the state of saturation by means of an increasing current in one of the secondary electric circuits 14a, 14b. As shown in FIG. 2a, the magnetization curve is first traveled by an increasing current in one of the secondary electric circuits starting from a operating point AP predefined by the residual current ΔI in the direction of the positive state of saturation, the positive feedback causing only one of the two secondary electric circuits 14a, 14b to carry the major part of the current flow in each case and the respectively other to be almost blocked. The operating point AP is determined only by the residual current ΔI flowing on the primary side because in this state the magnetic fluxes caused by the secondary currents cancel each other out. The traveling of the magnetization curve is caused by the current flow in the secondary electric circuits 14a, 14b. When the positive state of saturation is reached, a controlled switching of the secondary currents takes place due to the positive feedback circuit in that the increasing secondary current turns into a decreasing current while the current in the respectively other secondary electric circuit 14a, 14b increases and the magnetization curve is again traveled from the positive state of saturation in the direction of the operating point AP (FIG. 2b) predefined by the residual current ΔI and past it into the negative state of saturation (FIG. 2c). In the negative state of saturation, the currents switch again in the reversed direction (FIG. 2d). The switching from an increasing/decreasing secondary current to a decreasing/increasing current corresponds to a sign change of the differentiated secondary current, the duration of an increasing/decreasing secondary current (current flow time) depending on the position of the operating point AP on the magnetization curve. The course of the sign change corresponds to the control signal sequences for the switches S1 and S2. These complementary signal sequences of switches S1 and S2 thus are a temporally modulated oscillator signal, which temporally represents the magnetic change of state.

Figure 3:
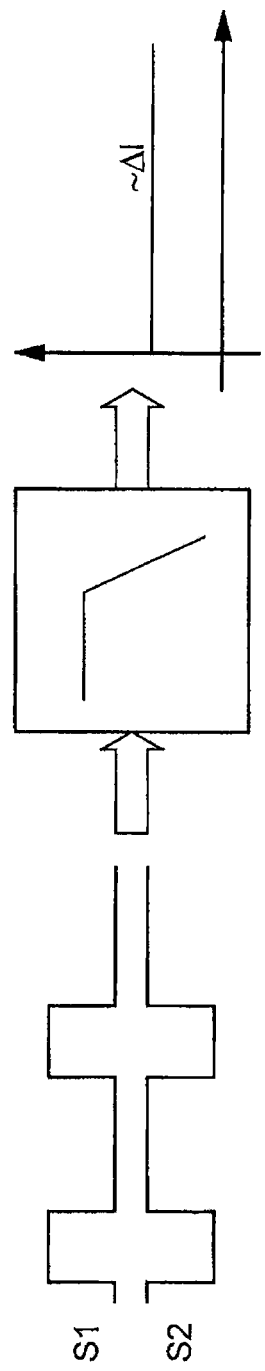
FIG. 3: schematically shows an oscillator signal derived from the magnetization curve of FIG. 2 with a subsequent low-pass filtering

FIG. 3 schematically shows an oscillator signal which is derived from the magnetization curve according to FIG. 2, is composed of the two signal sequences of the switches S1, S2 and is subjected to a subsequent low-pass filtering. As a function of the position of the operating point AP determined by the residual current ΔI, high/low phases of the modulated oscillator signal of different length occur, which lead to a direct portion proportional to the residual current, which can be determined in the subsequent low-pass filtering. In this context, the signal sequences of the switches S1, S2 are evaluated in parallel to achieve a doubling of the sensitivity.

Figure 4:
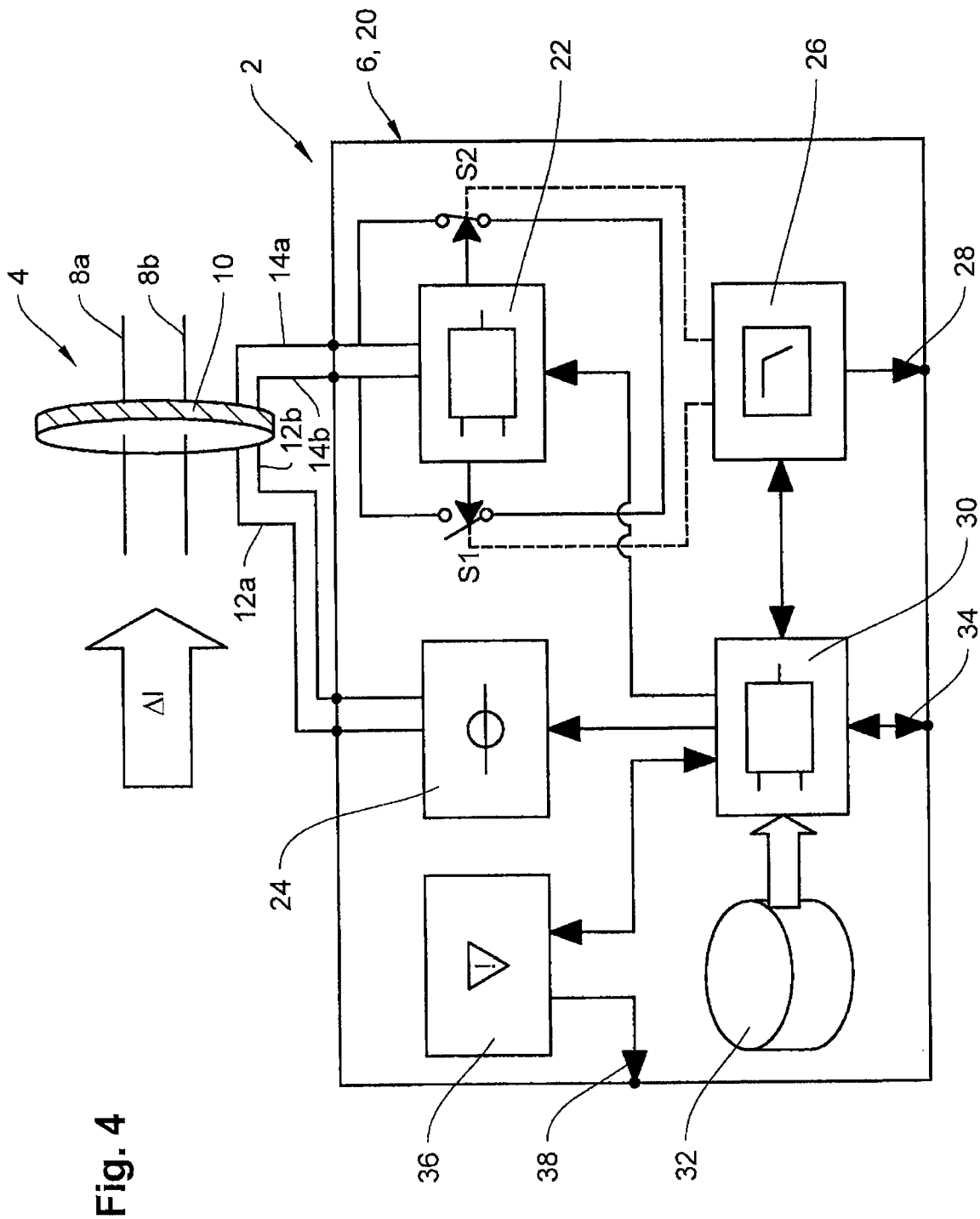
FIG. 4: shows a functional block diagram of a measuring device as an integrated circuit.

In FIG. 4, a functional block diagram of the measuring device 2 including a relaxation oscillator circuit 6 implemented as an integrated circuit 20 is shown. The integrated circuit 20 comprises a controlled oscillator 22, corresponding to the control logic 18 in FIG. 1, with two switch elements S1, S2 for controlling the oscillation, and a controlled supply 24 of the secondary electric circuits 14a, 14b corresponding to the voltage source 16. The integrated circuit 20 processes both analog signals in the functional blocks controlled oscillator 22 and controlled supply 24 and digital signals in the functional blocks described in the following.

In a digital evaluation circuit 26, a signal proportional to the residual current ΔI is obtained from the modulated oscillator signal, which is formed by the complementary signal sequences of switches S1 and S2, following an A/D conversion with digital processing methods, said signal proportional to the residual current ΔI being provided to an analog output 28 of the evaluation circuit 26 as an output signal converted to analog. The digital evaluation circuit 26 is based on an interconnection of precise comparators, fast digital counters with a wide dynamic range and a fast dividing arithmetic unit and realizes a digital averaging.

Further, the integrated circuit 20 comprises a monitoring and control unit 30, which monitors certain parameters of the controlled supply unit 24 and of the controlled oscillator 22 on the basis of a stored measuring current transformer model 32 and makes corrections, if necessary. The data stored in the measuring current transformer model 32 may describe the transfer function of the measuring current transformer 4 or may be a T-equivalent circuit of the measuring current transformer 4, for example.

The monitoring and control unit 30 has a digital interface 34 for communication in connection with an interface protocol. The output signal proportional to the residual current can be output as a digital signal via said interface 34.

A diagnostic unit 36 for testing and monitoring the function of the relaxation oscillator circuit 6, which is included in the integrated circuit 20, improves the reliability of the measuring device 2 and permits its use also for safety-critical applications. Application options of this kind are supported by an alert signal output 38.

The invention claimed is:

1. A method for a galvanically isolated alternating current/direct current (AC/DC)-sensitive measurement of a residual current, including an oscillator circuit generating an oscillator signal adapted to be temporally modulated and having an oscillator frequency and that has a component sensitive to magnetic fields coupled via two secondary windings to form inductive components of the oscillator circuit and which takes on a linear magnetic state, a positive saturated magnetic state, and a negative saturated magnetic state of a magnetization curve in the course of the oscillation and switches between the linear magnetic state, positive saturated magnetic state, and negative saturated magnetic states, said method comprising:
forming a residual current-driven magnetic field in a sphere of action of a component sensitive to magnetic fields due to a residual current;
generating the oscillator signal within the oscillator circuit and the oscillator signal having only two states 1 and 2 such that the oscillator signal switches directly between the state 1 and the state 2 at said saturated points, wherein times of stay of the oscillator signal that occur in states 1 and 2 are determined as a function of an operating point on the magnetization curve of the residual current-driven magnetic field; and
generating an output signal proportional to the residual current from a ratio of said times of stay; wherein the times of stay are determined by a counting pulse derived from the oscillator frequency and whose clock rate is higher than the oscillator frequency.

2. The method according to claim 1, wherein the oscillator signal is generated and the times of stay are determined and the output signal proportional to the residual current is obtained on a digital level by methods of digital signal processing in an integrated circuit.

3. The method according to claim 2, wherein the integrated circuit processes analog and digital signals.

4. The method according to claim 2, wherein the oscillator signal is generated by an oscillator circuit controlled by a monitoring and control unit.

5. The method according to claim 4, wherein the control of the oscillator circuit by the monitoring and control unit is based on a model of the component sensitive to magnetic fields.

6. The method according to claim 2, wherein testing and monitoring of the function of the oscillator circuit is performed by a diagnostic unit.

7. The method according to claim 2, implemented as an application-specific integrated circuit.

8. The method according to claim 1, wherein the output signal proportional to the residual current is output as an analog signal.

9. The method according to claim 1, wherein the output signal proportional to the residual current is additionally output as a digital signal via a digital interface.

10. A device for a galvanically isolated alternating current/direct current (AC/DC)-sensitive measurement of a residual current, said device comprising:
an oscillator circuit having an oscillator frequency and a component sensitive to magnetic fields coupled via two secondary windings to form inductive components of the oscillator circuit and which takes on at least a linear, a positive saturated, and a negative saturated magnetic state of a magnetization curve in the course of the oscillation and switches between the linear, positive saturated, and negative saturated states, said oscillator circuit generating an oscillator signal having only two states 1 and 2 adapted to be temporally modulated such that the oscillator signal switches directly between the state 1 and the state 2 at said saturation points depending on a position of an operation point on the magnetization curve;
a magnetic field formed in a sphere of action of the component sensitive to magnetic fields due to residual current; and
an evaluation circuit determining times of stay of the oscillator signal occurring in states 1 and 2 as a function of the residual current-driven magnetic field and generating an output signal proportional to the residual current from a ratio of said times of stay wherein for determining the times of stay, the evaluation circuit further includes a counting circuit generating a counting pulse derived from the oscillator frequency and whose clock rate is higher than the oscillator frequency.

11. The device according to claim 10, wherein the oscillator circuit and the evaluation circuit are digital circuits in an integrated circuit.

12. The device according to claim 11, wherein the integrated circuit includes circuit elements processing analog and digital signals.

13. The device according to claim 11, wherein the integrated circuit includes a monitoring and control unit controlling the oscillator circuit.

14. The device according to claim 13, wherein the integrated circuit includes storage for storing a model of the used component sensitive to magnetic fields.

15. The device according to claim 11, wherein the integrated circuit includes a diagnostic unit testing and monitoring the function of the oscillator circuit.

16. The device according to claim 11, wherein the integrated circuit is an application-specific integrated circuit.

17. The device according to claim 10, including a signal output for an output signal proportional to the residual current and converted to analog.

18. The device according to claim 10, including a digital interface for redundant output of a digital output signal proportional to the residual current.

* * * * *